United States Patent
Gupta et al.

(10) Patent No.: US 10,827,652 B2
(45) Date of Patent: Nov. 3, 2020

(54) EXPANDABLE RACK MOUNTABLE COMPUTING DEVICE

(71) Applicant: CISCO TECHNOLOGY, INC., San Jose, CA (US)

(72) Inventors: Rohit Dev Gupta, Bangalore (IN); Parag Ghate, Bangalore (IN); Shailesh R. Nayak, Bangalore (IN)

(73) Assignee: CISCO TECHNOLOGY, INC., San Jose, CA (US)

( * ) Notice: Subject to any disclaimer, the term of this patent is extended or adjusted under 35 U.S.C. 154(b) by 671 days.

(21) Appl. No.: 15/440,644

(22) Filed: Feb. 23, 2017

(65) Prior Publication Data

US 2018/0242477 A1    Aug. 23, 2018

(51) Int. Cl.
*H05K 5/00* (2006.01)
*H05K 7/20* (2006.01)
*H05K 7/14* (2006.01)

(52) U.S. Cl.
CPC ....... *H05K 7/20736* (2013.01); *H05K 7/1489* (2013.01); *H05K 7/20145* (2013.01)

(58) Field of Classification Search
CPC ............. H05K 7/20736; H05K 7/1489; H05K 7/20145
USPC ........................................................ 454/184
See application file for complete search history.

(56) References Cited

U.S. PATENT DOCUMENTS

| | | | |
|---|---|---|---|
| 5,366,099 A * | 11/1994 | Schmid .................. | A47F 1/126 211/175 |
| 6,966,784 B2 * | 11/2005 | Van Schuylenbergh ..................... | H01R 12/78 361/261 |
| 7,074,123 B2 * | 7/2006 | Bettridge .................. | F24F 9/00 312/236 |
| 8,305,756 B2 * | 11/2012 | Regimbal ............ | H05K 7/2019 361/695 |
| 8,310,832 B2 | 11/2012 | Vanderveen et al. | |
| 8,767,391 B2 * | 7/2014 | Jin ..................... | H05K 7/20563 312/236 |
| 8,804,333 B2 | 8/2014 | Ashby | |
| 10,301,870 B2 * | 5/2019 | Kelly .................... | E04B 1/7076 |
| 2010/0263825 A1 | 10/2010 | Noteboom et al. | |
| 2011/0068073 A1 | 3/2011 | Hervey | |
| 2013/0115869 A1 * | 5/2013 | Alshinnawi ........ | H05K 7/20736 454/184 |
| 2015/0144686 A1 * | 5/2015 | Miranda .............. | B65D 5/5246 229/101 |

* cited by examiner

*Primary Examiner* — Helena Kosanovic
(74) *Attorney, Agent, or Firm* — Polsinelli PC (57) ABSTRACT

An expandable rack mountable computing device for use in a variety of telecommunications and computing racks comprises a computing device chassis, at least one expandable baffle, at least one biasing mechanism, and at least one expansion mechanism. During installation of the computing device into a rack, the biasing mechanism holds the at least one expandable baffle in a retracted position at least partially inside of the computing device chassis. After installation of the computing device into a rack, the expansion mechanism pushes the at least one expandable baffle into a retracted position at least partially outside of the computing device chassis.

15 Claims, 7 Drawing Sheets

EXPANDABLE RACK MOUNTABLE COMPUTING DEVICE

TECHNICAL FIELD

The present technology pertains to rack mountable computing devices, and more specifically to a rack mountable computing device having an expandable baffle(s).

BACKGROUND

Rack mountable computing devices are extensively used in numerous operations around the world, from server farms to telecommunication switching centers, as rack mountable computing devices have proven advantageous due to factors such as a compact footprint and an efficient use of vertical space. However, several different standards for the racks themselves have evolved. Most notably, the different standards prescribe different widths between adjacent vertical support posts of the racks. For example, common standards include: the Electronic Industries Alliance (EIA) 19 inch rack; the European Telecommunications Standards Institute (ETSI) 21 inch rack; and the American National Standards Institute (ANSI) 23 inch rack.

It can be challenging for manufacturers of rack mountable computing devices to provide compatibility with the various rack standards and widths that are available. Furthermore, various rack widths are often intermingled in the same environment, providing a further logistical challenge. Most commonly, rack mountable computing devices have been designed to fit in the narrowest rack in which their use is anticipated, e.g. a 19 inch rack. The same rack mountable computing device can then be installed in wider racks with the use of adapter brackets. For example, to install a 19 inch rack mountable computing device in a 21 inch rack, the adapter brackets would need to be fashioned to provide at least two inches of additional width.

However, such a use of adapter brackets is sub-optimal, as it wastes valuable additional space that is present in the volume directly behind the adapter brackets and adjacent to the chassis of the rack mountable computing device. Additionally, there is often significant space behind the rack posts themselves, which is also unused.

Previous solutions provide standalone air plenums that can be attached to the sides of a rack mountable computing device after it has been installed in a rack. The installation of these standalone air plenums is difficult and time consuming, requiring unimpeded access to both the right and left hand sides of the rack mountable computing device. Additionally, by virtue of being standalone components, these air plenums are not integrated or otherwise communicatively coupled with the rack mountable computing device. Unable to house additional electronics modules, such standalone air plenums are restricted to only providing an increased volume for cooling.

DETAILED DESCRIPTION

The present disclosure is made with reference to the attached figures, wherein like reference numerals are used throughout the figures to designate similar or equivalent elements. The figures are not drawn to scale and they are provided merely to illustrate the instant invention. Several aspects of the disclosure are described below with reference to example applications for illustration. It should be understood that numerous specific details, relationships, and methods are set forth to provide a full understanding of the disclosure. One having ordinary skill in the relevant art, however, will readily recognize that the disclosure can be practiced without one or more of the specific details or with other methods. In other instances, well-known structures or operations are not shown in detail to avoid obscuring relevant portions of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

Various embodiments of the disclosure are discussed in detail below. While specific implementations are discussed, it should be understood that this is done for illustration purposes only. A person skilled in the relevant art will recognize that other components and configurations may be used without departing from the spirit and scope of the disclosure.

Figure 1:
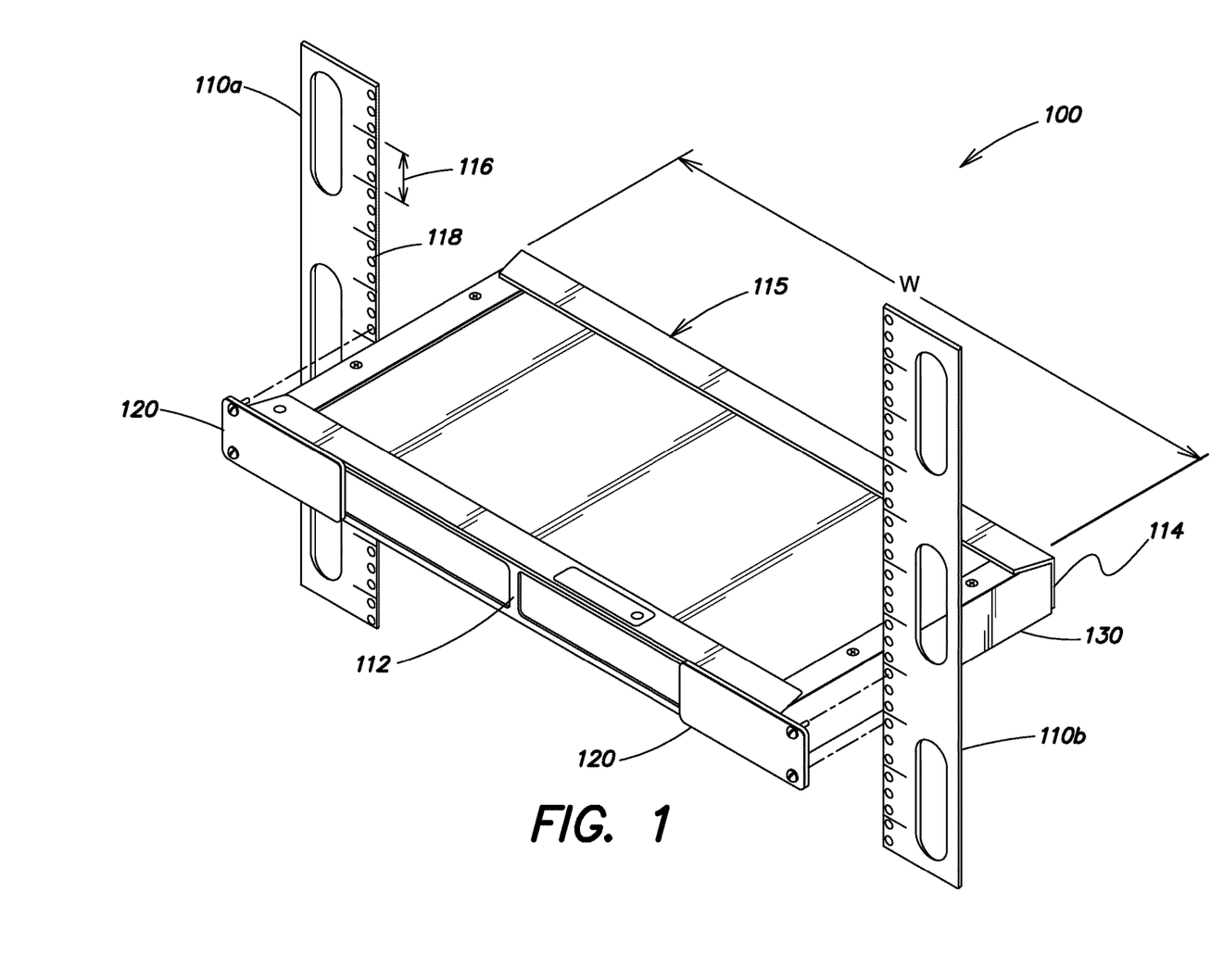
FIG. 1 illustrates a perspective view of an example embodiment of an expandable rack mountable computing device installed into a rack.

FIG. 1 illustrates a perspective view of an expandable rack mountable computing device 100 being installed into a rack 110. In some embodiments, expandable rack mountable computing device 100 can consist of a server or server blade, telecommunications switching equipment, modems, and various other computing devices and electronic devices known in the art. While no specific rack standard is depicted in FIG. 1, such standards include the Electronic Industries Alliance (EIA) 19 inch wide rack, the European Telecommunications Standards Institute (ETSI) 21 inch wide rack, and the American National Standards Institute (ANSI) 23 inch wide rack.

As illustrated, expandable rack mountable computing device 100 consists of a chassis 115, a front face 112, a rear face 114, an expandable baffle 130 (shown here in the un-expanded or retracted position), and adapter brackets 120. In some embodiments, a second expandable baffle can be provided, for example, on the left hand side of chassis 115 (not visible), opposite of expandable baffle 130, such that the two expandable baffles form respective lateral sides of chassis 115. Chassis 115 can have a hollow interior or body into which computing elements such as line cards and fans can be inserted and removed as desired. Chassis 115 is characterized by a width w, which is substantially equal to a width of front face 112 and a width of rear face 114. In some cases, front face 112 can be slightly wider than chassis 115, due to additional width added by adapter brackets 120. Although adapter brackets 120 are only shown extending from front face 112, additional adapter brackets may similarly be provided from rear face 114, in order to more securely install expandable computing device 100 into a rack 110.

Rack 110 consists of four rack posts arranged in a rectangular fashion, although only front left rack post 110a and front right rack post 110b are depicted. Each rack post contains various anchor points, illustrated herein as a plurality of evenly spaced circular openings 112, sized to receive screws or various other connectors and fasteners that can be used to removably attach computing device 100 and adapter brackets 120 to rack 110. Multiple rack mountable computing devices of various sizes can be installed in rack 110 in a generally vertical manner, one on top of another, wherein the rack post height defines the number of computing devices that can be installed. Rack post height is commonly measured in rack units (U, 1 U=1.75 inches), with typical full-size rack cages measuring 42 U. As illustrated, rack 110 provides three circular openings 118 per rack unit (U) 116 that can be used to install a rack mountable computing device, wherein installation consists of securing each adapter bracket 120 to one or more of the circular openings 118 using screws or other removable connectors.

It is noted that the chassis width w is less than or equal to the width of the opening defined between the front left and front right rack posts, such that the entirety of chassis 115 can slide through the opening during installation. In FIG. 1, the chassis width w is substantially equal to the width defined between rack posts 110a, 110b. Because the sliding installation process precludes chassis width w from being larger than the rack opening width, substantial empty space remains behind rack posts 110a, 110b once a rack-mountable computing device is installed. As will be further explained below, the expandable baffles of the present disclosure are capable of expanding into and utilizing this otherwise wasted space.

Figure 2A:
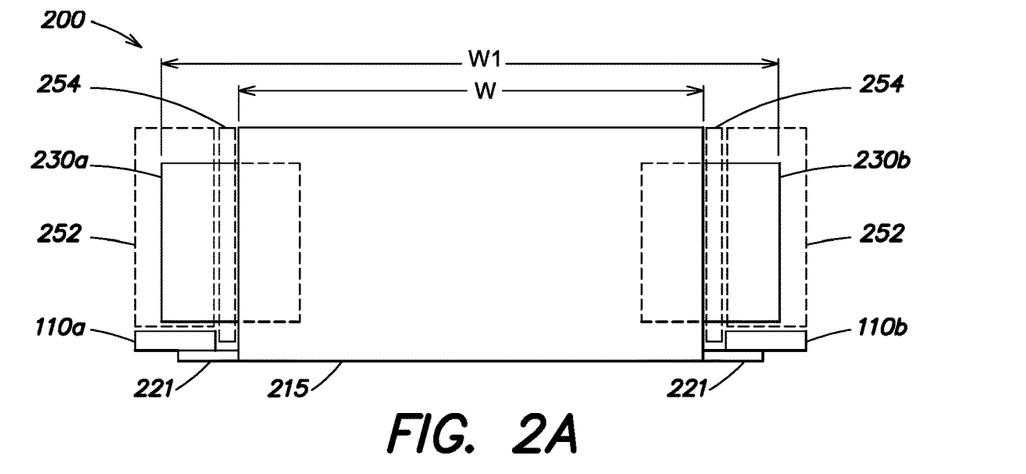
FIG. 2A illustrates a top-down view of an example embodiment of an expandable rack mountable computing device installed into a rack.
Figure 2B:
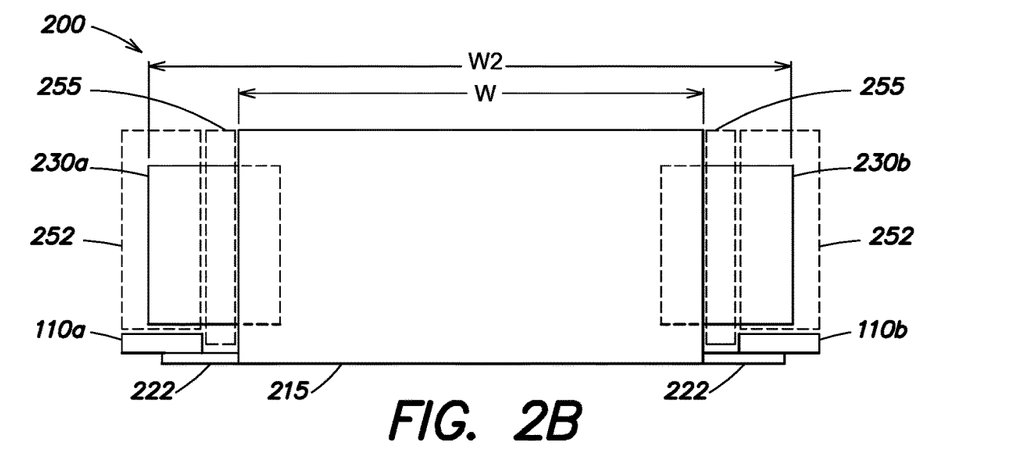
FIG. 2B illustrates a top-down view of an example embodiment of an expandable rack mountable computing device installed into a rack.
Figure 2C:
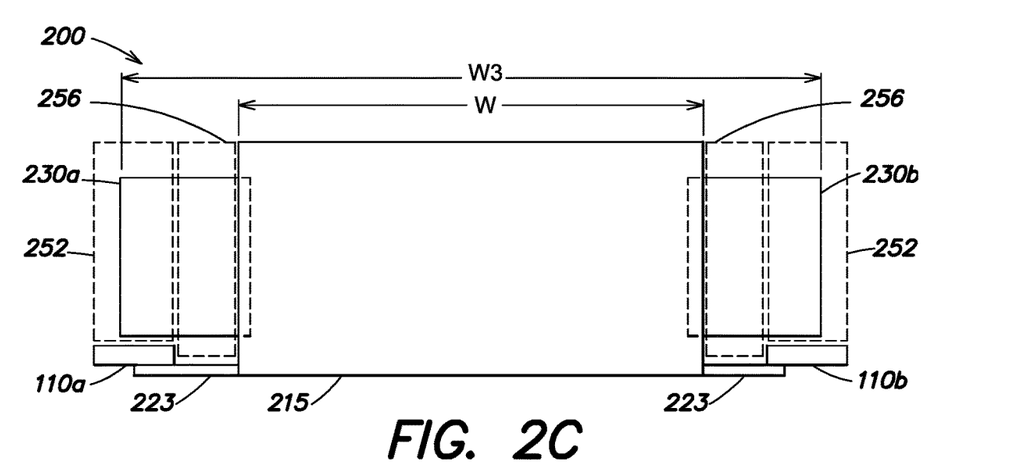
FIG. 2C illustrates a top-down view of an example embodiment of an expandable rack mountable computing device installed into a rack.

This otherwise wasted space is best appreciated in FIGS. 2A-2C, which illustrate a top-down view of an expandable rack mountable computing device 200, with a chassis width w of approximately 19 inches, that has been installed into racks of various widths. Rack mountable computing device 200 contains two expandable baffles 230a, 230b, that are laterally movable, relative to chassis 215, between a retracted position during installation and an expanded position during operation.

In the retracted position, the expandable baffles 230a, 230b would be contained within chassis 215 (e.g. see expandable baffle 130 of FIG. 1 in the retracted position). In the expanded position, variously shown in each of FIGS. 2A-2C, the expandable baffles 230a, 230b are protrude beyond chassis 215 and into what otherwise would be wasted space within the rack. Presently contemplated is the wasted space in a rack mountable environment (characterized as either behind-rack space 252 or mismatch space 254, 255, and 256) that the expandable baffles are designed to capture or otherwise make use of. Subsequently described will be various mechanisms and further details regarding the function and design of the expandable baffles of the present disclosure.

Behind-rack space is the wasted space behind the rack posts (i.e. 110a and 110b). Recalling that the requirement for sliding installation limits chassis 215 to having a width w no wider than the opening between the rack posts, it is appreciated the behind-rack space 252 will remain empty on either side of chassis 215. The issue of this wasted space is most problematic with taller computing devices (rack mountable computing devices are commonly available up to 4 U), as it is appreciated that, all else equal, a 4 U computing device will waste four times as much space as a 1 U computing device. While the total volume of wasted space varies with computing device height, it is noted that the cross-sectional area of each behind-rack space 252 remains constant, as it is intrinsically tied to the width of the rack posts 110a, 110b themselves.

Mismatch space (254, 255, 256) is the wasted space due to the difference between the rack opening width (i.e. the distance between rack posts 110a and 110b) and the chassis width w, and consequently, is different in each of the three configurations presented by FIGS. 2A-2C.

In FIG. 2A, 19 inch wide computing device 200 is installed into a 19 inch rack, such as an EIA rack, in what can be referred to as an exact fit. In order to aid installation and reduce frictional contact and wear between chassis 215 and the rack posts 110a, 110b, a small tolerance is commonly provided by decreasing the chassis width w to be slightly smaller than 19 inches, increasing the rack opening width to be slightly larger than 19 inches, or some combination of the two. This leaves a mismatch space 254 on either side of chassis 215. As was the case with behind-rack spaces 252, the issue of mismatch space is most problematic with taller computing devices.

In FIG. 2B, 19 inch wide computing device 200 is installed into a 21 inch rack, such as an ETSI rack. This can be referred to as a non-exact fit. In order to compensate for this non-exact fit, adapter brackets 222 must be extended, and possibly reinforced, relative to adapter brackets 221 seen in FIG. 2A. For example, due to the two-inch difference in width, each adapter bracket 222 might be extended one inch, although it is possible to extend a single adapter bracket by two inches while leaving the other adapter bracket unchanged relative to adapter bracket 221. Regardless of how adapter brackets 222 are configured, there results a mismatch space 255 on either side of chassis 215, wherein mismatch space 255 is larger than mismatch space 254.

In FIG. 2C, 19 inch wide computing device 200 is installed into a 23 inch rack, such as an ANSI rack. This is another non-exact fit, and once again, adapter brackets 223 must be extended, and possibly reinforced, relative to both adapter brackets 221 seen in FIG. 2A and adapter brackets 222 seen in FIG. 2B. For example, due to the four-inch difference in width, each adapter bracket 223 might be extended two inches, although it is possible to extend a single adapter bracket by four inches while leaving the other adapter bracket unchanged relative to adapter bracket 221. Regardless of how adapter brackets 223 are configured, there results a mismatch space 256 on either side of chassis 215, wherein mismatch space 256 is larger than either mismatch space 254 or mismatch space 255.

In general, expandable baffles 230a, 230b are designed to maximize the use of the wasted space consisting of behind-rack space 252 and mismatch space 254, 255, and 256. As such, it is desirable to have the baffles expand a commensurately larger amount when the wasted space is increased. As will be discussed below, by capturing the wasted space, expandable baffles 230a, 230b can provide additional functionality and performance to computing device 200. For example, the expandable baffles can be used to provide an additional airflow plenum to increase the cooling performance, and therefore the computational performance, of computing device 200. The expandable baffles can also be used to provide an additional enclosure for electronics components or line cards that can be used to increase the computational power or performance of computing device 200.

The amount of expansion of expandable baffles 230a, 230b can be judged in light of the effective width of expandable computing device 200. When the baffles are in a retracted or un-expanded position, the effective width of computing device 200 is the chassis width w. When the baffles are in an expanded position, the effective width of computing device 200 is the chassis width w plus the width to which each baffle has extended.

For example, in FIG. 2A the effective width of computing device 200 is w1, which is illustrated relative to the unexpanded chassis width w. In FIG. 2B, the effective width of computing device 200 is w2, which is wider than w1 or w, and in FIG. 2C, the effective width of computing device 200 is w3, which is wider than w2, w1, and w. Although these figures illustrate a series of discrete expanded positions and effective widths, it is understood that in some embodiments, the expandable baffles can be adjusted through a series of continuous positions in order to provide any effective width that is desired.

Figure 3A:
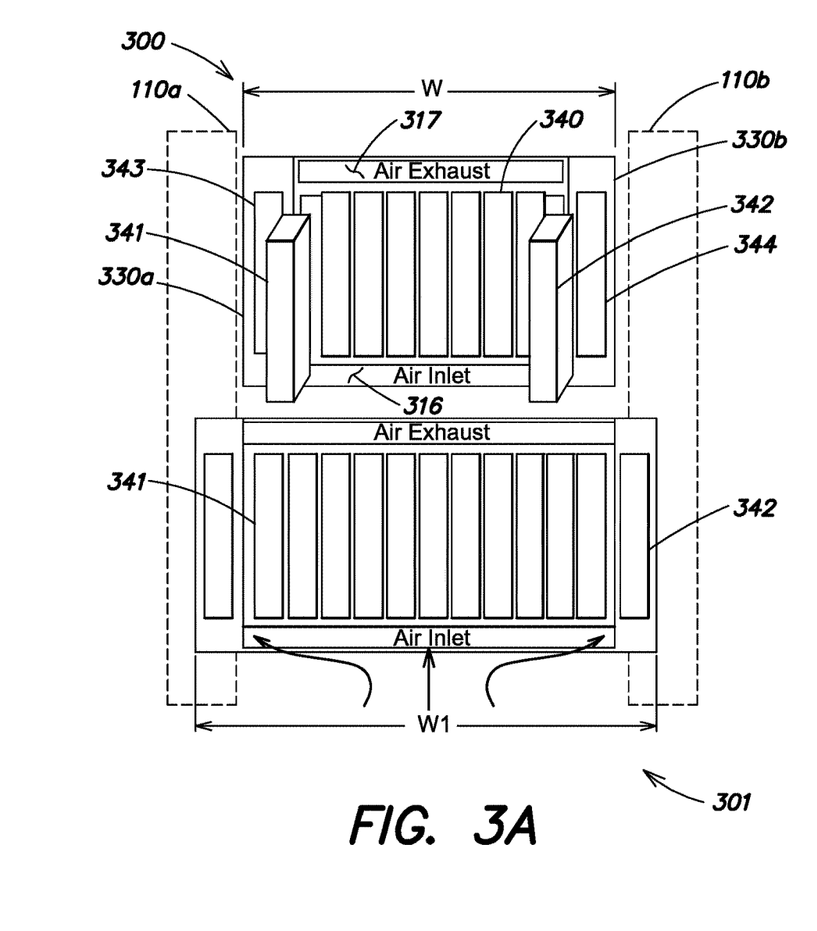
FIG. 3A illustrates a front view of an example embodiment of an expandable rack mountable computing device with vertical line cards installed into a rack.

FIG. 3A depicts a front view of an expandable rack mountable computing device 300 that contains a plurality of vertical line cards 340 that can be installed or removed as desired. Provided on the lateral edges of computing device 300 are expandable baffles 330a, 330b, which can be pre-installed in computing device 300. As illustrated, expandable baffles 330a, 330b are in the retracted position, and contained within the chassis of the computing device 300 such that the effective width w of computing device 300 and expandable baffles 330a, 330b in the retracted position is less than the width of the opening between adjacent rack posts 110a, 110b, as discussed above.

Also provided on computing device 300 are an air inlet 316 and an air exhaust 317. As opposed to the plurality of vertical line cards 340, air inlet 316 and air exhaust 317 are situated horizontally. A fan (not shown) draws air in from the bottom via air inlet 316, forces the air upwards across the plurality of vertically installed line cards 340, and then vents the air out from the top via air exhaust 317, in the process absorbing heat from various electronic components and then removing it to the environment.

As illustrated, expandable baffle 330a contains a line card 343, and expandable baffle 330b contains a line card 344. In some embodiments, expandable baffles 330a, 330b are pre-installed into the chassis of computing device 300, in which case line cards 343 and 344 may also be pre-installed. In some embodiments, expandable baffles 330a, 330b may be provided without a pre-installed line card, in which case line cards 343 and 344 can be installed at a later time by a user of computing device 300.

In computing device 300, pre-installed expandable baffles 330a, 330b do not make contact with any of the plurality of vertical line cards 340, and therefore remain in a maximally retracted position, illustrated here as a position in which the bodies of expandable baffles 330a, 330b are entirely contained within the chassis of computing device 300. In the maximally retracted position, the width w of the chassis of computing device 300 is less than the width of the opening between adjacent rack posts 110a, 110b. The retracted position generally is present when the number of line cards 340 contained within computing device 300 is less than some maximum number of line cards that computing device 300 is capable of holding. In order to ensure reliable operation, one or more biasing mechanisms (not presently shown) can be coupled between expandable baffles 330a, 330b and an interior surface of the chassis of computing device 300 in order to provide a biasing force that urges the expandable baffles into the retracted position. For example, it can be helpful to have a biasing mechanism to ensure expandable baffles 330a, 330b will remain in the retracted position while computing device 300 is installed into a rack. In this manner, computing device 300 functions in a substantially similar fashion to known, fixed chassis rack mountable computing devices.

However, once some capacity threshold is reached, expandable baffles 330a, 330b will make contact with the plurality of line cards 340. For example, when line cards 341, 342 are installed, the expandable baffles 330a, 330b are pushed laterally outwards, such that they extend beyond the chassis of computing device 300 and into the area of wasted space behind rack posts 110a, 110b. This places expandable baffles 330a, 330b into an expanded position, illustrated by way of expanded computing device 301, which depicts computing device 300 after line cards 341, 342 are fully installed. In order to ensure reliable operation, one or more expansion mechanisms can be installed in order to provide the requisite expansion force sufficient to overcome the biasing force and push expandable baffles 330a, 330b into the expanded position. In some embodiments, the expansion mechanism can be provided by the direct contact between expandable baffles 330a, 330b and line cards 341, 342, although various other mechanisms can be provided that do not directly rely upon one or more of the plurality of line cards 340.

In this manner, the otherwise wasted space discussed above can be reclaimed, and a greater density of line cards can be achieved. In the expanded position, expandable baffles 330a, 330b may still be partially contained within the chassis of computing device 301, or may fully extend beyond the confined of the chassis of computing device 301. The chassis of computing device 301, as a result of expandable baffles 330a, 330b being urged into the expanded position, presents a larger effective width w1, than the effective width w of the chassis of the computing device 300, with expandable baffles 330a, 330b in the retracted position.

Notably, the effective width w1 of the chassis of computing device 301 is wider than the opening between adjacent rack posts 110a, 110b, meaning that installation of expanded computing device 301 would be impossible. In other words, the presently disclosed expandable baffles are advantageous because they provide for a built-in transition between a compact installation size and an expanded operational size that requires no additional user intervention after the computing device 300 or 301 has been installed into a rack.

Figure 3B:
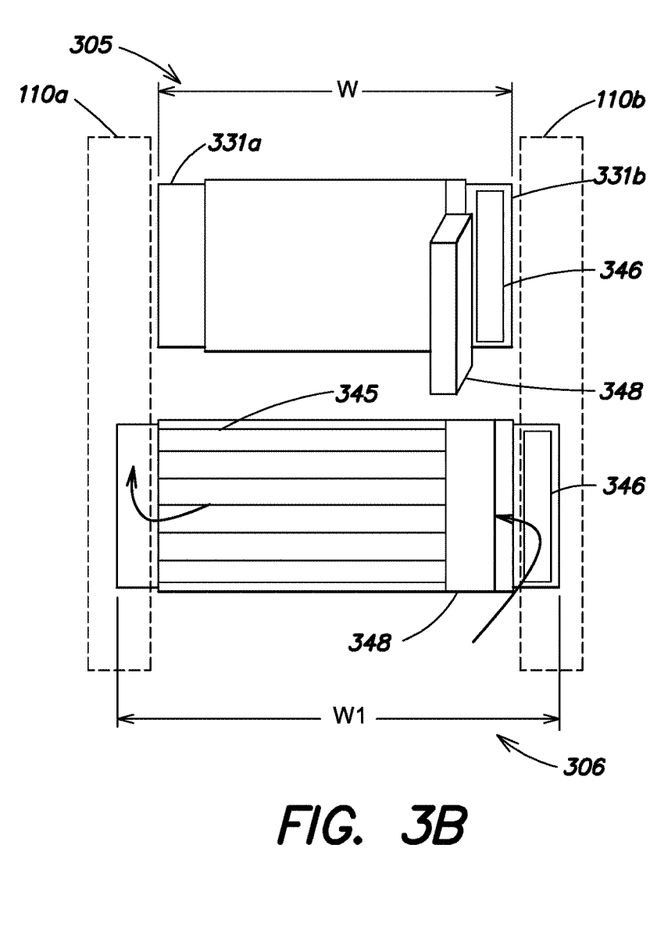
FIG. 3B illustrates a front view of an example embodiment of an expandable rack mountable computing device with horizontal line cards installed into a rack.

While FIG. 3A illustrates expandable baffles 330a, 330b as both containing line cards or additional electronic components, in some embodiments one or more of the expandable baffles can be provided as an airflow plenum for increased cooling performance. FIG. 3B depicts a front view of an expandable rack mountable computing device 305 that can receive a plurality of horizontal line cards 345 that may be installed or removed as desired. Provided on the lateral edges of computing device 305 are expandable baffles 331a, 331b, which are oriented in a vertical fashion and can be pre-installed in computing device 305. As illustrated, expandable baffles 331a, 331b are in the retracted position, and contained within the chassis of computing device 305 such that the effective width w of computing device 305 and expandable baffles 331a, 331b in the retracted position is less than the width of the opening between adjacent rack posts 110a, 110b, as discussed above.

As illustrated, expandable baffle 331a contains an air plenum, which can be provided as a hollow interior volume that is generally sealed to the ambient environment. Expandable baffle 331b contains a line card 346, installed in a vertical fashion. As opposed to the expandable baffles 330a, 330b of FIG. 3A, the presently discussed expandable baffle 331a does not contain a line card or other electronic components.

In computing device 305, expandable baffles 331a, 331b are in a maximally retracted position, as discussed above with respect to computing devices 300, 301, and may likewise be held in place by one or more biasing mechanisms (not presently shown). In this maximally retracted position, the effective width w of the chassis of computing device 305 is once again less than the width of the opening between adjacent rack posts 110a, 110b.

When one or more of the plurality of horizontal line cards 345 is installed, expandable baffle 331a is pushed laterally outwards to extend beyond the chassis of computing device 305 and into an area of wasted space behind rack post 110a. When a vertically oriented fan tray 348 is installed, expandable baffle 331b is pushed laterally outwards to extend beyond the chassis of computing device 305 and into an area of wasted space behind rack post 110b. This places expandable baffles 331a, 331b into an expanded position, illustrated by way of expanded computing device 306, which depicts computing device 305 once the plurality of horizontal line cards 345 and fan tray 348 have been installed. In some embodiments, expandable baffle 331b may only be pushed laterally outwards after both fan tray 348 and one or more horizontal line cards have been installed. In order to ensure reliable operation, one or more expansion mechanisms can be provided in order to provide the requisite expansion force sufficient to overcome the biasing force and push expandable baffles 331a, 331b into the expanded position. In some embodiments, the expansion mechanism can be provided by the direct contact between expandable baffles 331a, 331b, one or more of the plurality of line cards 345, and fan tray 348, although various other mechanisms can be provided that do not directly rely upon this contact.

Fan tray 348 contains one or more cooling fans that draw in air through fan tray 348 and then cause the air to flow across the plurality of line cards 345 (and line card 346) and absorb heat generated by various electronic components. The heated air then passes into the plenum provided by expandable baffle 331a, before being vented into the ambient environment via an air exhaust (not shown).

The expandable rack mountable computing devices shown in FIGS. 3A and 3B are all front-accessible while offering expanded volumes for one or more of improved cooling via additional air plenums and improved computing performance via one or more additional line card modules. In conventional systems, a user would require side access to an already installed rack mountable computing device in order to install any additional air plenums or line card modules. Understandably, such installations are rigid and doubly burdensome in terms of wasted time—additional air plenums or line card modules can only be installed after the computing device is installed in the rack, and the computing device cannot be removed from the rack until the additional air plenums or line card modules are removed. Furthermore, in many modern computing environments, racks are provided in dense configurations, where adjacent racks may be touching or even sharing a common rack post. In such environments, side-access ranges from highly difficult to achieve to downright impossible. As such, the presently disclosed expandable baffles provide improved functionality, ease of use and installation, and greater modularity in the variety of add-on modules or air plenums that can be installed, by virtue of requiring only front access.

Figure 4A:
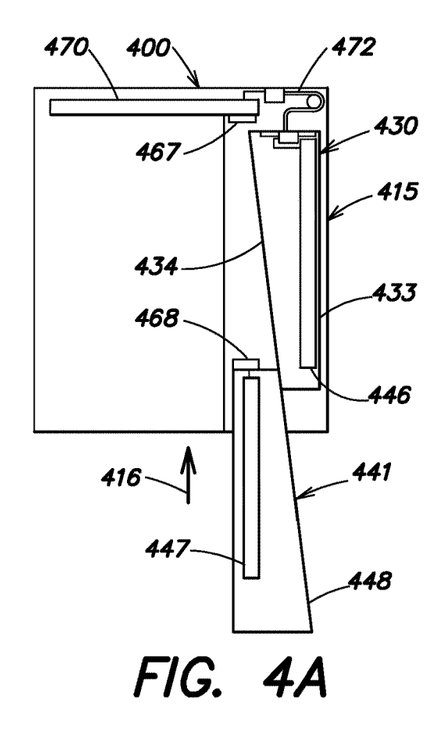
FIG. 4A illustrates a top-down view of an example embodiment of an expandable baffle with a wedge-shaped insert in the retracted position.

FIG. 4A depicts a top-down view of an expandable rack mountable computing device 400 with an expandable baffle 430 in a fully retracted position. Expandable baffle 430 contains a line card 446, which may be pre-installed or user installed. Line card 446 is communicatively coupled to system backplane 470 via a flexible connector 472. System backplane 470 provides general high-level control functionality and management of the various line cards and modules that can be installed into a rack mountable computing device such as computing device 400. Flexible connector 472, which can be a connector only or can be a rigid-flex printed circuit board (PCB), permits the repeated movement of expandable baffle 430 in and out of the chassis 415 of computing device 400. In some embodiments, expandable baffle 430 may be configured as an airflow plenum, in which case line card 446 would be removed and flexible connector 472 would be removed or simply not utilized. In some embodiments, expandable baffle 430 may be configured as an airflow plenum with an additional electronics module, such as line card 446.

Expandable baffle 430 is wedge shaped, such that it is wider at a rear end (closest to system backplane 470) and narrower at a front end (closest to the front opening of chassis 415). As illustrated, an outer face 433 of expandable baffle 430 is substantially parallel to the outer right-hand face of chassis 415, while an inner face 434 of expandable baffle 430 is angled, thereby providing the discussed wedge shape.

A line card carrier 441 is similarly wedge shaped, having an angled wedge face 448 that can be provided to have an identical or similar angle to that of inner face 434 of expandable baffle 430. Line card carrier 441 can contain a line card 447 that may be either pre-installed or can be selected as desired by a user, although line card carrier 441 can function and be installed without a line card if so desired. Line card carrier 441 additionally includes a contact 468 to communicatively couple line card 447 to a corresponding contact 467 of system backplane 470. Contact 468 and corresponding contact 467 may be flexible or rigid.

In FIG. 4A, line card carrier 441 has just been inserted into a front opening of chassis 415, such that its wedge face 448 makes first contact with inner face 434 of expandable baffle 430. To continue the installation process, line card carrier 441 is pushed further into the interior of chassis 415, towards the rear face containing system backplane 470, as indicated by directional arrow 416.

Figure 4B:
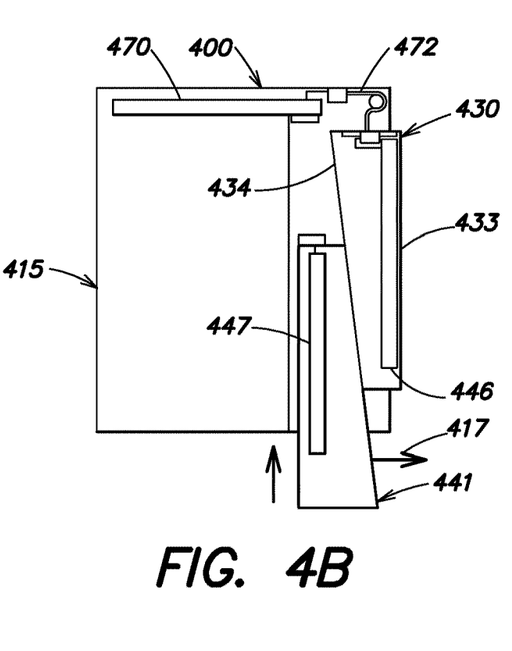
FIG. 4B illustrates a top-down view of an example embodiment of an expandable baffle with a wedge-shaped insert being moved into the expanded position.

In FIG. 4B, line card carrier 441 has been inserted approximately halfway into chassis 415, causing expandable baffle 430 to slide laterally outward as indicated by directional arrow 417, such that outer face 433 of expandable baffle 430 is no longer contained within the volume defined by chassis 415. In response to this lateral movement of expandable baffle 430, flexible connector 472 flexes or extends in order to compensate for the increased distance between expandable baffle 430 (and line card 446) and system backplane 470.

Figure 4C:
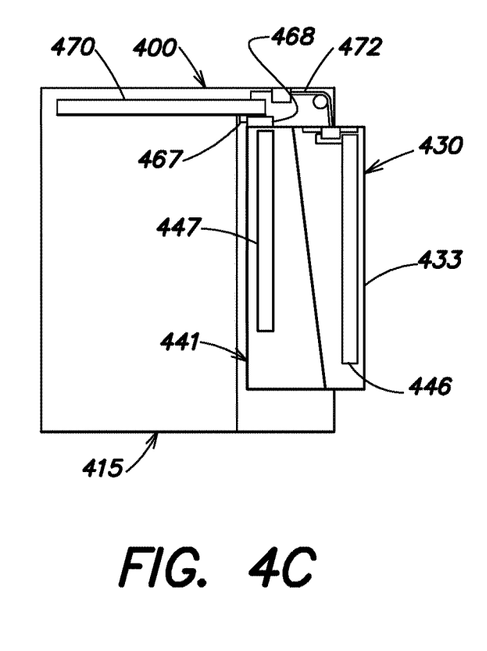
FIG. 4C illustrates a top-down view of an example embodiment of an expandable baffle with a wedge-shaped insert in the expanded position.

In FIG. 4C, line card carrier 441 has been fully inserted into chassis 415, such that line card 447 and its contact 468 are communicatively coupled with corresponding contact 467 of system backplane 470. Line card carrier 441 has caused expandable baffle 430 to further slide laterally outward, such that outer face 433 of expandable baffle 430 has moved even farther away from chassis 415 relative to its position in FIG. 4B. In response to this further lateral movement of expandable baffle 430, flexible connector 472 further flexes or extends to maintain the communicative coupling between line card 446 and system backplane 470. This is the fully extended position of expandable baffle 430 for the particular line card carrier 441. In other words, it may be possible that expandable baffle 430 could extend farther from chassis 415 if so desired—however, a wider line card carrier would be required to achieve and maintain such an expansion.

In general, the interaction between line card carrier 441 and expandable baffle 430 provides the expansion mechanism and the expansion force required to move expandable baffle 430 from a retracted position to an expanded position. The expansion can be controlled or adjusted in a variety of ways, including but not limited to, changing the angle of one or more of wedge face 448 of line card carrier 441 and inner face 434 of expandable baffle 430, changing the width of one or more of line card carrier 441 and expandable baffle 430, and changing an insertion angle of line card carrier 441.

As discussed previously, a biasing mechanism can also be provided, although none is illustrated in FIGS. 4A-4C. Such a biasing mechanism provides a biasing force that can be constant or variable, where the biasing force acts to hold expandable baffle 430 in the retracted position. In some embodiments, a biasing mechanism can be provided by one or more springs or other flexible members coupled between an expandable baffle and an interior of a chassis of an expandable rack mountable computing device of the present disclosure, as seen in FIG. 5.

Figure 5:
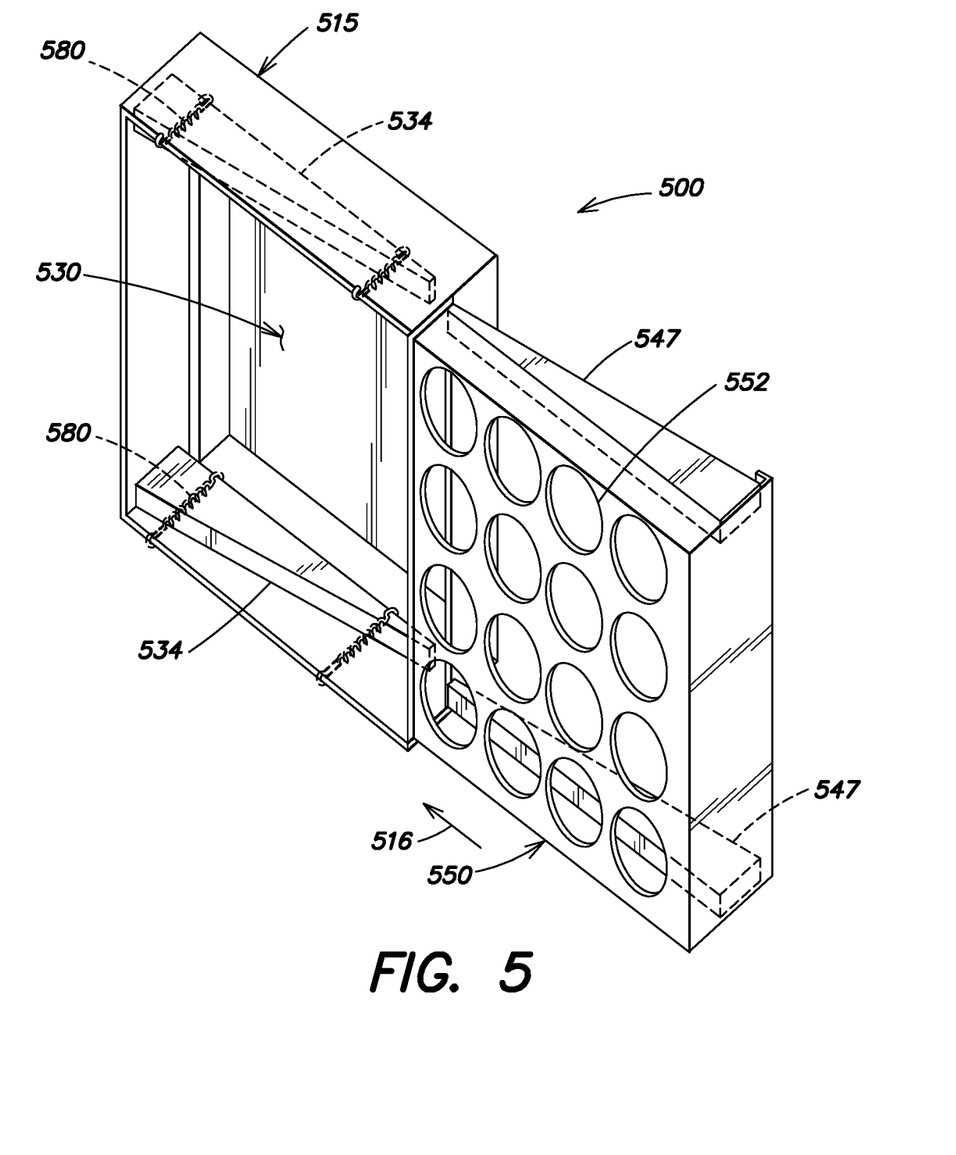
FIG. 5 illustrates a perspective view of an example embodiment of an expandable baffle with a wedge-shaped insert and a fan tray with a wedge-shaped insert.

FIG. 5 presents a partial perspective view an expandable rack mountable computing device 500. An expandable baffle 530 is coupled to a chassis 515 of computing device 500 via springs 580, which constitute the previously discussed biasing mechanism and provide a biasing force via their restorative spring force. Expandable baffle 530 additionally includes two wedge shaped inserts 534 which function in the manner described above. In some embodiments the two wedge shaped inserts 534 can be integrally formed with expandable baffle 530, while in some embodiments the two wedge shaped inserts 534 can be optionally installed onto expandable baffle 530 by a user who so desires. Regardless of whether the wedge shaped inserts 534 are removable, each wedge shaped insert is coupled to chassis 515 of computing device 500 by two springs, one at each end of the wedge shaped insert, although it is appreciated that any number or positioning of springs may be employed without departing from the scope of the present disclosure. Additionally, various other elastic mechanisms or components may be utilized as a biasing mechanism, which is not restricted exclusively to springs. Additionally, the biasing mechanism need not be manual or purely mechanical. For example, a small electromagnet may be used to provide a constant or variable biasing force instead of a spring.

FIG. 5 depicts a fully retracted position of expandable baffle 530, where springs 580 are at their minimum length and additionally are in a relaxed state; that is, the springs as illustrated exert a pulling force acting to pull expandable baffle 530 towards the interior of chassis 515. In order to transition expandable baffle 530 into an expanded position, a fan tray 550 is inserted into a front opening of chassis 515 and urged backwards as indicated by directional arrow 516, in the same manner as described above with respect to FIGS. 4A-4C. Fan tray 550 includes a plurality of ventilation holes 552 that permit airflow induced by a fan (not shown). Fan tray 550 can be used, for example, as described with respect to computing device 305, 306 shown in FIG. 3B. Although specific reference will be made to fan tray 550, it is understood that in some embodiments, a line card carrier such as line card carrier 441 may be used in place of fan tray 550.

Fan tray 550 further includes two wedge shaped inserts 547, which can either be integrally formed with the fan tray or optionally removable as desired. In some embodiments, the wedge shaped inserts 534 of expandable baffle 530 can be identical to the wedge shaped inserts 547 of fan tray 550. In some embodiments, wedge shaped inserts 534 and wedge shaped inserts 547 can be different, for example, to achieve the desired expanded position of expandable baffle 530. In general, the expandable baffles will expand a distance that is at least equal to the maximum combined thickness measured across a combined wedge shaped insert 534 and wedge shaped insert 547 when fan tray 550 is fully inserted and the two wedge shaped inserts are fully engaged with one another.

As fan tray 550 is inserted into chassis 515 and urged in the direction 516, wedges 547 and wedges 534 engage with one another and begin to laterally push expandable baffle 530 away from chassis 515. Simultaneously, springs 580 are stretched a corresponding amount, and exert an increased biasing force that can be linearly proportional to the lateral distance traveled by expandable baffle 530. In some embodiments, the biasing spring force can be designed such that it may be overcome by a normal sliding movement of fan tray 550, such that an individual is not required to exert undue force to cause expandable baffle 530 to expand. When fan tray 550 is removed, the above described process reverses itself, with expandable baffle 530 slowly retracting back into the interior of chassis 515, pulled in that direction by the biasing spring force of springs 580.

Figure 6A:
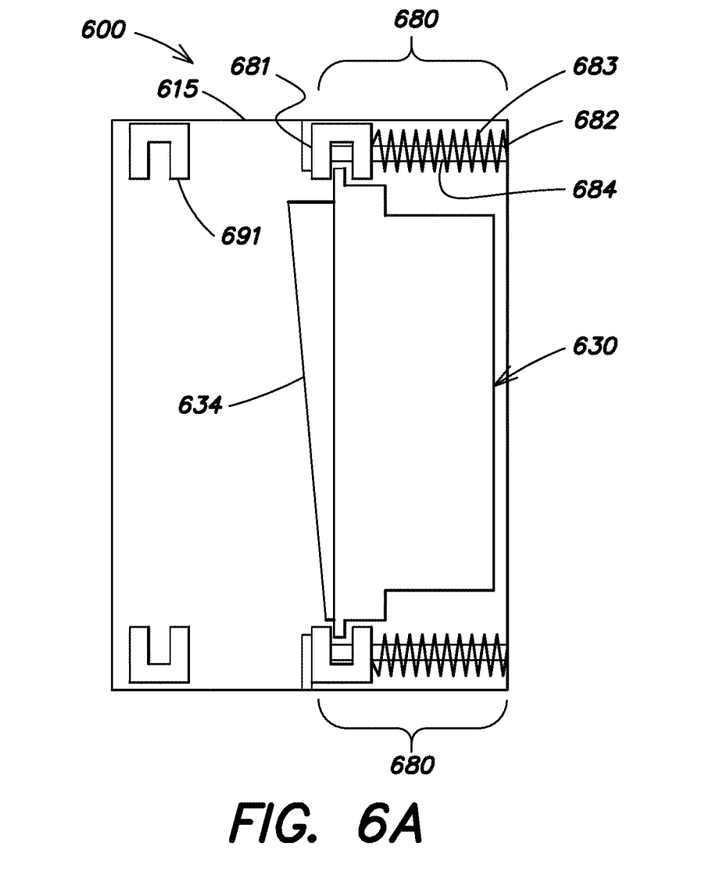
FIG. 6A illustrates a top-down view of an example embodiment of an expandable rack mountable computing device with fixed and sliding card guides.

FIG. 6A depicts a top-down view of an expandable rack mountable computing device 600 that includes a biasing mechanism 680, depicted herein as a spring 683 that is attached at its first end to a sliding card guide 681 and attached at its second end to an interior point 682 of a chassis 615 of computing device 600. Sliding card guide 681 can slide laterally along a corresponding rail 684, and is coupled to expandable baffle 630, illustrated here as an air plenum, although it is understood that expandable baffle 630 may also incorporate a line card if a flexible connector is added to couple the additional line card to the system backplane, as described previously. A fixed card guide 691 is also depicted, and expandable baffle 630 additionally comprises a wedge shaped insert 634 consistent with the previously described wedge shaped inserts.

As illustrated, spring 683 is in a relaxed position corresponding to its maximum length. This is the opposite of the spring-based biasing mechanism 580 of FIG. 5, wherein the relaxed position corresponded to the minimum length. This is because biasing mechanism 680 and spring 683 operate under compression, pushing expandable baffle 630 towards the interior of chassis 615, whereas the biasing mechanism of spring 580 operates under extension, pulling expandable baffle 630 towards the interior of chassis 615.

Figure 6B:
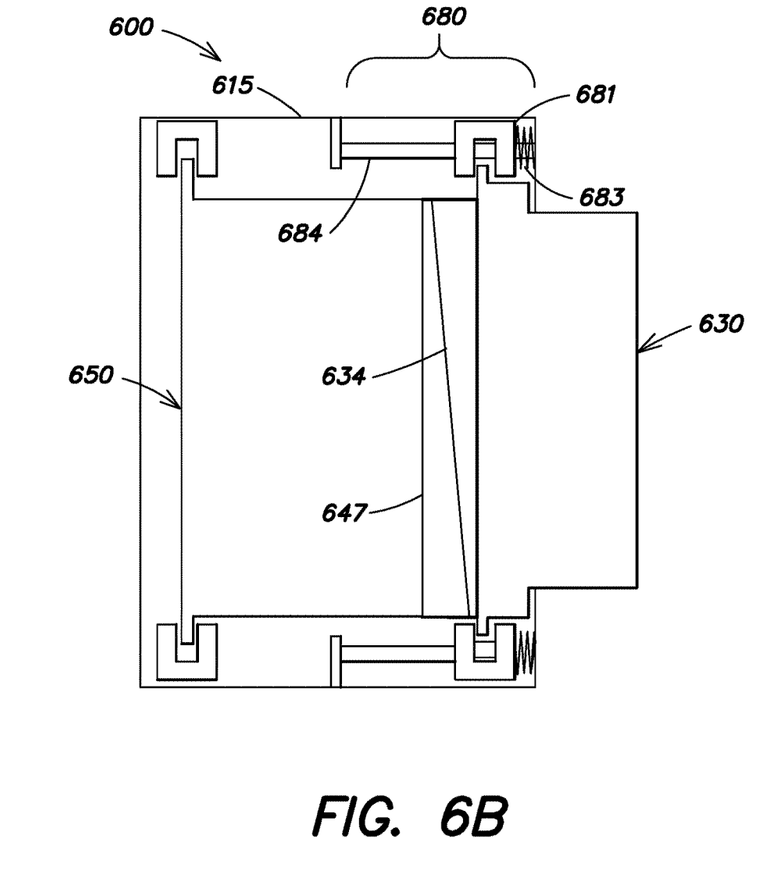
FIG. 6B illustrates a top-down view of an example embodiment of an expandable rack mountable computing device with fixed and sliding card guides.

In FIG. 6B, computing device 600 has been moved into an expanded position wherein expandable baffle 630 extends beyond the interior of the volume defined by chassis 615. An additional line card 650, or some other module, that includes a wedge shaped insert 647, has been inserted (as described previously) to overcome the biasing force of biasing mechanism 680 and cause expandable baffle 630 to expand. In this position, sliding card guide 681 has traveled down the corresponding rail 684, to hold expandable baffle 630 in its newly expanded position. As was the case previously, the extent of the expansion can be adjusted by modifying the interaction between additional line card 650 and expandable baffle 630, and in particular, by modifying characteristics of the wedge shaped inserts 634 and 647. Additionally, while the previous figures have made reference to a variety of wedge shaped inserts, in some embodiments, wedge shaped inserts may not be used at all, and a different edge geometry such as curved or linear may be used. In some embodiments, biasing mechanism 680 may be provided without spring 683. For example, biasing mechanism 680 could be a piston, wherein sliding card guide 681 forms the piston head and the corresponding rail 684 forms the piston shaft.

Figure 7A:
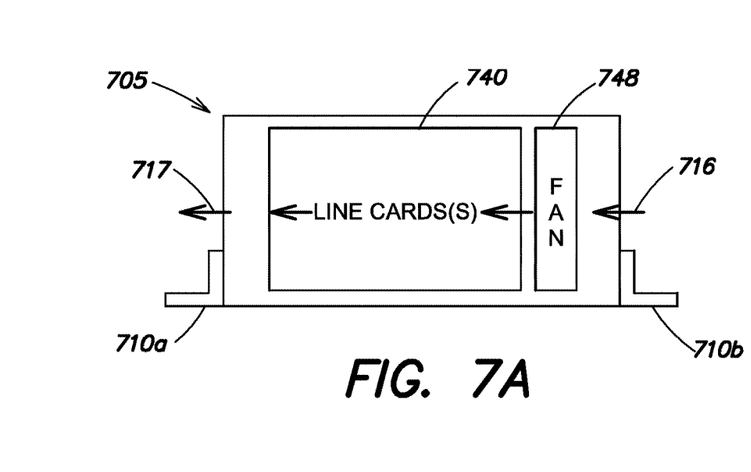
FIG. 7A illustrates a top-down view of a typical non NEBS compliant rack mountable computing device.

FIGS. 7A-7D present several different configurations in which the expandable baffles of the present disclosure are used to provide additional airflow plenum space. FIG. 7A depicts a typical rack mountable computing device 705 installed in a 19 inch rack, although other rack widths and geometries may be provided. Only rack posts 710a, 710b are depicted, although it is understood that a corresponding back left and back right rack post are also provided. Typical rack mountable computing device 705 includes a plurality of line cards 740, which may be installed in either a vertical or horizontal manner, and further includes a fan 748, vertically installed on the right-hand side of the plurality of line cards 740.

Fan 748 draws in air from an air inlet 716 provided on the right-hand side of a chassis of the typical rack mountable computing device 705 and passes the air over the plurality of line cards, where the air absorbs heat. Fan 748 then causes the air to be exhausted through an air exhaust 717 provided on the left-hand side of the chassis. This side-to-side airflow is NEBS non-compliant (Network Equipment-Building System), which is the most common set of safety, spatial and environmental design guidelines applied to telecommunications equipment in the United States. NEBS compliancy requires front-to-back airflow in rack mountable computing devices, which is a requirement that oftentimes proves difficult to implement on already installed equipment.

Figure 7B:
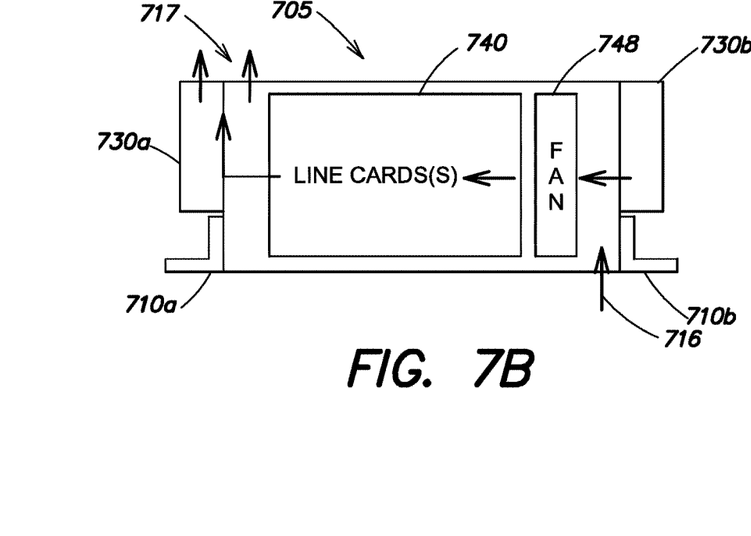
FIG. 7B illustrates a top-down view of an example embodiment of a NEBS compliant expandable rack mountable computing device with air plenums.

In an advantage of the present disclosure, expandable baffles may be retrofit onto typical rack mountable computing device 705, as seen in FIG. 7B, which shows retrofit expandable baffles 730a, 730b. It is noted that unlike the previously contemplated rack posts 110a, 110b, rack posts 710a, 710b are L-shaped, a geometric consideration that yields increased strength, meaning rack posts 710a, 710b can support heavier (or more) rack mountable computing devices. Consequently, expandable baffles 730a, 730b have been reduced in size accordingly, and in particular, reduced in length, as measured from the front opening of computing device 705 to the rear face of computing device 705.

Air inlet 716 has been relocated to the front face of computing device 705, for example, by modifying or replacing fan 748 with a fan module with the appropriate front air inlet. Expandable baffle 730b functions as an air plenum, providing an additional volume for cooling air. Expandable baffle 730a also functions as an air plenum, and contains the relocated air exhaust 717. In this manner, expandable baffles 730a, 730b allow a non-NEBS compliant rack mountable computing device 705 to be retrofit to achieve NEBS compliancy.

Figures 7C, 7D:
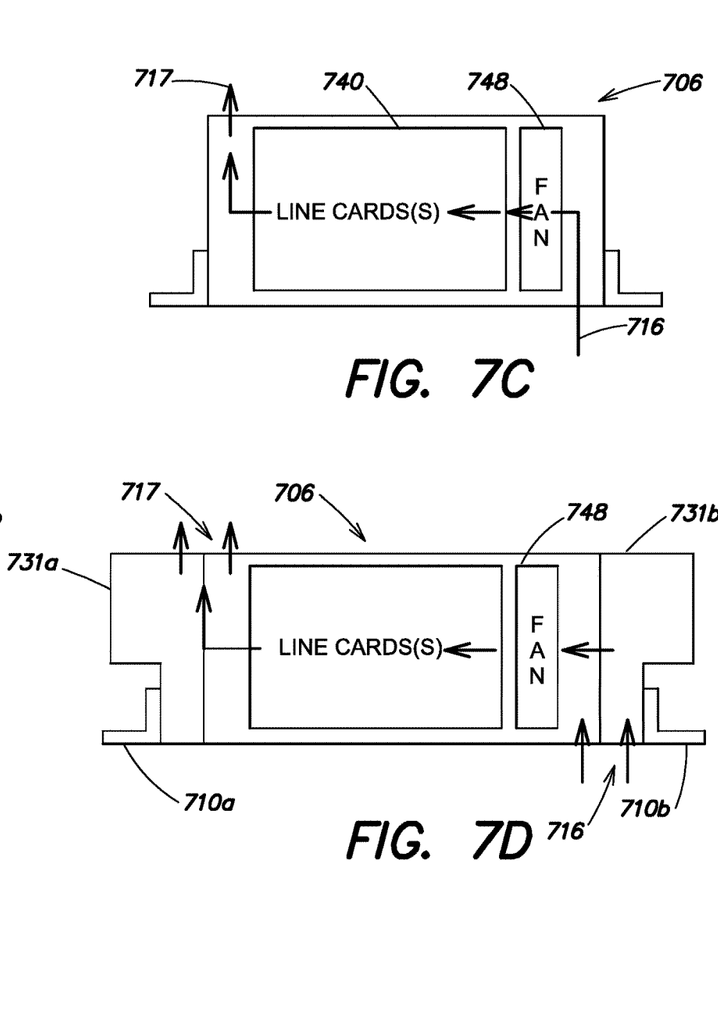
FIG. 7C illustrates a top-down view of a typical NEBS compliant rack mountable computing device.
FIG. 7D illustrates a top-down view of an example embodiment of a NEBS compliant expandable rack mountable computing device with air plenums.

FIG. 7C illustrates a typical rack mountable computing device 706 that is already NEBS compliant, with a single front air inlet 716 and a single back air exhaust 717. For purposes of illustration, rack mountable computing device 706 is depicted as being installed in a 23 inch wide rack. Although already NEBS-compliant, rack mountable computing device 706 can nonetheless benefit from the expandable baffles of the present disclosure, as illustrated in FIG. 7D.

FIG. 7D depicts typical rack mountable computing device 706 retrofit with two expandable baffles 731a, 731b. Expandable baffle 731b functions as an air plenum, providing an additional volume for cooling air, and effectively doubles the intake area of air inlet 716, thereby providing more cooling power for a given airflow rate caused by fan 748. Expandable baffle 731a also functions as an air plenum, providing an additional volume for cooling air, and effectively doubles the outflow area of exhaust 717, thereby providing more cooling power. In some embodiments, one or more of expandable baffles 731a, 731b can contain an additional fan in order to increase the airflow rate through the retrofit computing device 706.

Methods according to the aforementioned description can be implemented using computer-executable instructions that are stored or otherwise available from computer readable media. Such instructions can comprise instructions and data which cause or otherwise configure a general purpose computer, special purpose computer, or special purpose processing device to perform a certain function or group of functions. Portions of computer resources used can be accessible over a network. The computer executable instructions may be binaries, intermediate format instructions such as assembly language, firmware, or source code. Computer-readable media that may be used to store instructions, information used, and/or information created during methods according to the aforementioned description include magnetic or optical disks, flash memory, USB devices provided with non-volatile memory, networked storage devices, and so on.

For clarity of explanation, in some instances the present technology may be presented as including individual functional blocks including functional blocks comprising devices, device components, steps or routines in a method embodied in software, or combinations of hardware and software.

The computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Devices implementing methods according to these disclosures can comprise hardware, firmware and/or software, and can take any of a variety of form factors. Such form factors can include laptops, smart phones, small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device.

The instructions, media for conveying such instructions, computing resources for executing them, and other structures for supporting such computing resources are means for providing the functions described in these disclosures.

Although a variety of information was used to explain aspects within the scope of the appended claims, no limitation of the claims should be implied based on particular features or arrangements, as one of ordinary skill would be able to derive a wide variety of implementations. Further and although some subject matter may have been described in language specific to structural features and/or method steps, it is to be understood that the subject matter defined in the appended claims is not necessarily limited to these described features or acts. Such functionality can be distributed differently or performed in components other than those identified herein. Rather, the described features and steps are disclosed as possible components of systems and methods within the scope of the appended claims. Moreover, claim language reciting "at least one of" a set indicates that one member of the set or multiple members of the set satisfy the claim.

What is claimed is:

1. An expandable rack mountable computing device having a front, back, top, bottom and first and second lateral sides, a distance between the first and second lateral sides defining a width of the expandable rack mountable computing device, the expandable rack mountable computing device comprising:
    a computing device chassis of the expandable rack mountable computing device, the computing device chassis defining a hollow body;
    an expandable baffle forming a portion of the first lateral side of the computing device chassis, the expandable baffle being laterally slideable between a retracted position wherein the expandable baffle is contained with the hollow body of the computing device chassis and an expanded position wherein a portion of the expandable baffle protrudes outside of the hollow body of the computing device chassis to enlarge the width of the expandable rack mountable computing device; and
    a wedge that has a front end narrower than a rear end, the wedge being insertable into the chassis;
    wherein insertion of the wedge into the chassis pushes the expandable baffle toward the expanded position.

2. The expandable rack mountable computing device of claim 1, further comprising:
    a biasing mechanism coupled between the expandable baffle and the computing device chassis to provide a biasing force that urges the expandable baffle into the retracted position;
    wherein insertion of the wedge into the chassis overcomes the biasing force to move the expandable baffle toward the expanded position;
    wherein removal of the wedge from the chassis allows the biasing force to move the expandable baffle toward the retracted position.

3. The expandable rack mountable computing device of claim 1, wherein the expandable baffle contains an air plenum with at least one of an air inlet and an air exhaust.

4. The expandable rack mountable computing device of claim 1, wherein the width of the computing device chassis is less than a width of a rack opening into which the computing device is installed when the expandable baffle is in the retracted position.

5. The expandable rack mountable computing device of claim 1, wherein the width of the computing device chassis is greater than a width of a rack opening into which the computing device is installed when the expandable baffle is in the expanded position.

6. The expandable rack mountable computing device of claim 1, wherein the hollow body defined by the computing device chassis is configured to receive one or more line cards.

7. The expandable rack mountable computing device of claim 1, wherein the expandable baffle contains an air plenum with at least one of an air inlet and an air exhaust.

8. The expandable rack mountable computing device of claim 1, wherein the expandable baffle contains an electronics module coupled to a backplane of the expandable rack mountable computing device.

9. The expandable rack mountable computing device of claim 8, wherein the electronics module is a line card, the line card coupled to the backplane of the expandable rack mountable computing device using a flexible connector or a flexible printed circuit board.

10. The expandable rack mountable computing device of claim 1, further comprising another expandable baffle forming a portion of the second lateral side of the computing device chassis, the another expandable baffle laterally slideable between a retracted position wherein the expandable baffle is contained with the hollow body of the computing device chassis and an expanded position wherein a portion of the another expandable baffle protrudes outside of the hollow body of the computing device chassis to enlarge the width of the expandable rack mountable computing device.

11. The expandable rack mountable computing device of claim 2, further comprising a spring biasing the expandable baffle to the retracted position.

12. The expandable rack mountable computing device of claim 1, further comprising a spring biasing the expandable baffle to the retracted position.

13. The expandable rack mountable computing device of claim 1, further comprising:
    a back plane for connecting to line cards in the chassis;
    the wedge includes:
        an area for receiving an electronic module; and
        an electronic connector at the front end of the wedge, the connector having a first portion shaped to connect to the backplane and a second portion shaped to connect to an electronic module in the area of the wedge.

14. The expandable rack mountable computing device of claim 1, further comprising an electronics module in the area of the wedge and connected to the electronic connector.

15. The expandable rack mountable computing device of claim 1, the wedge including ventilation holes to allow air to pass through.

* * * * *